US009897673B2

(12) United States Patent
Lenz

(10) Patent No.: US 9,897,673 B2
(45) Date of Patent: Feb. 20, 2018

(54) CIRCUIT ARRANGEMENT, GRADIENT AMPLIFIER, AND METHOD FOR COMPENSATING FOR NONLINEARITIES OF AN AMPLIFIER OUTPUT STAGE

(71) Applicant: Helmut Lenz, Oberasbach (DE)

(72) Inventor: Helmut Lenz, Oberasbach (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 15/434,463

(22) Filed: Feb. 16, 2017

(65) Prior Publication Data

US 2017/0234950 A1   Aug. 17, 2017

(30) Foreign Application Priority Data

Feb. 17, 2016   (DE) .................. 10 2016 202 443

(51) Int. Cl.
*G01R 33/385* (2006.01)
*H03F 1/32* (2006.01)
(Continued)

(52) U.S. Cl.
CPC ....... *G01R 33/3852* (2013.01); *H03F 1/3205* (2013.01); *H03F 3/2173* (2013.01); *H03K 17/60* (2013.01); *H03F 2200/351* (2013.01)

(58) Field of Classification Search
CPC ............................................. G01R 33/3852
See application file for complete search history.

(56) References Cited

U.S. PATENT DOCUMENTS 6,448,775 B1   9/2002 Lenz
6,949,915 B2 *  9/2005 Stanley ............... H02M 1/4208
                                                    323/207
(Continued)

FOREIGN PATENT DOCUMENTS

DE       19856800 C1   6/2000
DE   102012102728 A1  10/2012
WO   WO2013046099 A1   4/2013

OTHER PUBLICATIONS

German Office Action for related German Application No. 10 2016 202 443.4 dated Nov. 2, 2016, with English Translation.

*Primary Examiner* — Dixomara Vargas
(74) *Attorney, Agent, or Firm* — Lempia Summerfield Katz LLC

(57) ABSTRACT

A circuit arrangement for generating a current for an inductive load is provided. The circuit includes a switched output state, a modulator, a current measuring device, a controller, a compensator, and a summer. The switched output stage is configured to generate the current from a supply voltage. The modulator is configured to modulate the supply voltage of the output stage depending on a modulator input signal of the modulator. The current measuring device is configured to determine the actual value of the current. The controller is configured to generate a controller signal depending on a setpoint value of the current and the actual value of the current. The compensator is configured to generate from the setpoint value of the current at least one compensation control signal that compensates for nonlinearities of the output stage. The summer is configured to generate the modulator input signal additively from the controller signal and the at least one compensation control signal.

18 Claims, 12 Drawing Sheets

(51) Int. Cl.
*H03F 3/217* (2006.01)
*H03K 17/60* (2006.01)

(56) References Cited

U.S. PATENT DOCUMENTS

| | | | | |
|---|---|---|---|---|
| 7,403,400 B2 * | 7/2008 | Stanley | ............... | G05F 1/70 323/225 |
| 7,509,167 B2 * | 3/2009 | Stessman | ............ | A61N 1/3718 607/9 |
| 7,532,067 B2 * | 5/2009 | Albrecht | ............ | H03F 1/0238 330/127 |
| 8,013,609 B2 * | 9/2011 | Vartiovaara | ........ | G01R 33/3657 324/318 |
| 8,335,563 B2 * | 12/2012 | Stessman | ............ | A61N 1/3718 607/10 |
| 8,502,539 B2 | 8/2013 | Lai et al. | | |
| 8,674,696 B2 * | 3/2014 | Boettcher | ......... | G01R 33/3657 324/318 |
| 8,754,647 B2 * | 6/2014 | Van Helvoort | .... | G01R 33/3657 324/318 |
| 9,013,144 B2 * | 4/2015 | Cooley | ................ | H01G 11/58 320/107 |
| 9,206,672 B2 * | 12/2015 | Cooley | ............... | E21B 41/0085 |
| 9,287,795 B2 * | 3/2016 | Ma | | |
| 2012/0249145 A1 | 10/2012 | Lai et al. | | |
| 2014/0191568 A1 * | 7/2014 | Partovi | ................ | H02J 7/025 307/9.1 |
| 2014/0354281 A1 | 12/2014 | Scheel et al. | | |

\* cited by examiner

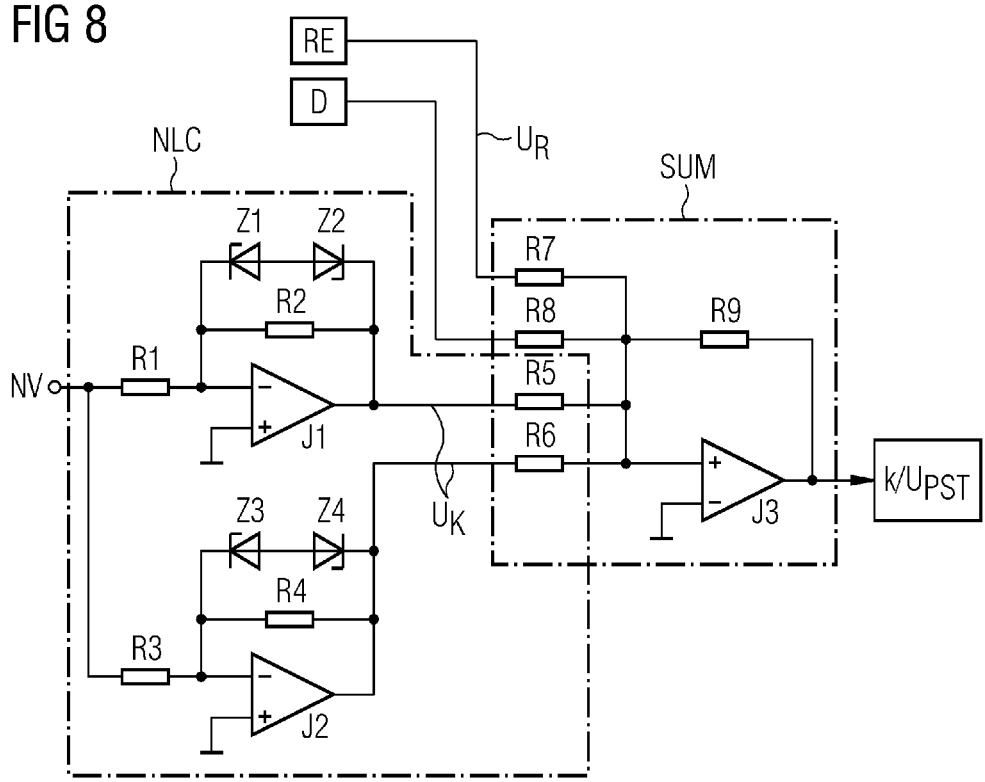
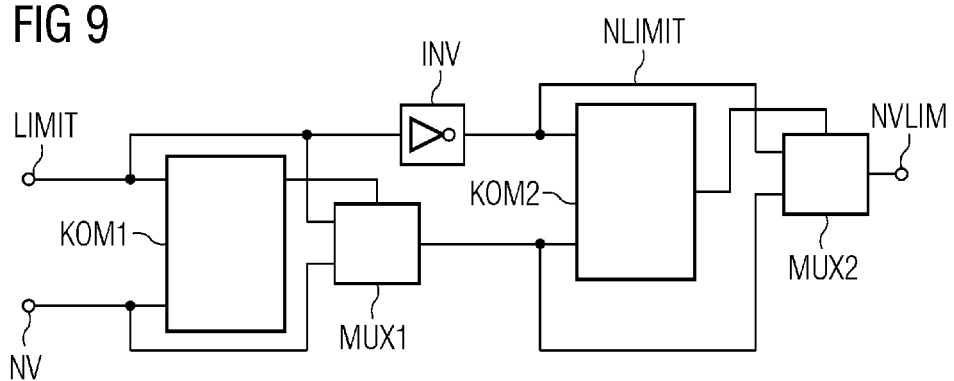

CIRCUIT ARRANGEMENT, GRADIENT AMPLIFIER, AND METHOD FOR COMPENSATING FOR NONLINEARITIES OF AN AMPLIFIER OUTPUT STAGE

CROSS-REFERENCE TO RELATED APPLICATIONS

This application claims the benefit of DE 102016202443.4 filed on Feb. 17, 2016, which is hereby incorporated by reference in its entirety.

TECHNICAL FIELD

Embodiments relate to a circuit arrangement, a gradient amplifier for magnetic resonance imaging, and a method for compensating for nonlinearities of an amplifier output stage.

BACKGROUND

In a gradient amplifier controlled by setpoint or actual value control, the characteristic curve "control voltage at the controller output with respect to output stage output voltage" is intended to be linear, e.g., the output stage output voltage is linearly proportional to the controller voltage. In fact, the characteristic curve is highly nonlinear particularly for low output voltages. The nonlinearity is caused by the forward voltages of the semiconductors (transistors, diodes) in the output stage, the safety times in the driving of the switching transistors, and a "tail current" of the insulated-gate bipolar transducer (IGBT) switching transistors.

The advance control of a differentiating element, configured with the inductance L of the gradient coil, in order to generate a driving in accordance with the formula "output voltage=L*di/dt", as described in the published patent application DE 198 56 800 A1, functions only if the characteristic curve "(controller+differentiating element)*K=output stage voltage" (K is an element of the real numbers) is linear in accordance with the equation. The nonlinearity present, depending on the current, leads to a deformation of the generated gradient pulses and to a current dependent gradient delay (i.e., a current dependent delay of the gradient pulses). The delay dependent on the gradient amplitude adversely affects the image quality, for example, in radial imaging.

In magnetic resonance imaging apparatuses, about 10% of the performance of the gradient amplifiers suffices for "normal" imaging, such that for "normal" imaging the GPAs of the output stage are constantly operated in the predominantly nonlinear region.

Published patent application WO 2013/046099 A1 proposes a solution of compensation by a three-dimensional lookup table that is loaded from a storage medium. The closed loop control method described is suitable only for digital signal processing as the complicated method does not function rapidly enough in real time. The closed loop control method described uses a controller output signal (1st dimension), an output voltage (2nd dimension), and a filter current (3rd dimension) for determining correction values of a modulation swing.

Closed loop control is a process in which the actual value of a variable is measured and matched to the setpoint value of the variable by readjustment. In open loop control, a machine or installation is influenced with the aid of a manipulated variable, without the controlled variable having a reactive effect on the manipulated variable.

SUMMARY AND DESCRIPTION

Embodiments provide a circuit arrangement, a gradient amplifier, and a method that provides compensation of nonlinearities of controlled and modulated semiconductor power output stages.

According to an embodiment, a compensation of the nonlinearity of a switched output stage is effected by a nonlinear advance control. The nonlinear advance control is a circuit branch in parallel with the advance control by a D component and a setpoint or actual control loop. From the setpoint value for the output stage (for example a gradient amplifier), with the aim of an advance control for compensating for the nonlinearities of the output stage, compensation control signals are generated that are linear with respect to the setpoint value up to individual limits (=knee points) and remain constant in the case of setpoint values above the limits. The compensation control signals are summed with the output of a control device and the output of the advance control by a D component to form a summation signal that serves for driving the output stage by a modulator device (for example by a pulse width modulator).

In an embodiment, a circuit arrangement is provided for generating a current, controlled by closed and open loop control for an inductive load. The circuit arrangement includes a switched output stage that generates the current from a supply voltage, a modulator that modulates the supply voltage of the output stage depending on a modulator input signal of the modulator device, a current measuring device that determines the actual value of the current, and a controller that generates a controller signal depending on a predefinable setpoint value of the current and the actual value of the current. The arrangement further includes a compensation device that generates from the setpoint value of the current at least one nonlinear compensation control signal that compensates for nonlinearities of the output stage in an advance controlling fashion and a summer that generates the modulator input signal additively from the controller signal and the at least one compensation control signal.

In an embodiment, owing to the nonlinear advance control, both the shape of the current pulses and the temporal delay ("gradient delay") may be kept constant independently of the amplitude. The outlay on circuitry and costs is low here in comparison with the improvement that may be achieved.

In an embodiment, the compensation control signal is in each case linear between determined knee points of the setpoint value of the current and is constant starting from the last knee point.

In a further embodiment, the compensation control signal is linear with a first gradient between zero and the first knee point, is linear with a second gradient between the first knee point and the second knee point and is constant starting from the second knee point.

In a further embodiment, the output stage has semiconductor switching elements. The compensation control signal compensates for the nonlinearities caused by the semiconductor forward voltages, by safety times during the switching of the switching elements and by nonlinear switching properties of the switching elements.

In an embodiment, the compensation circuit has two parallel connected operational amplifiers. The first inputs are input with the setpoint value of the current via resistors. The first inputs of the operational amplifiers are in each case connected to the associated outputs by two Zener diodes connected back-to-back in series and by resistors in parallel therewith.

In a further embodiment, the outputs of the operational amplifiers are connected to the inputs of the summer via resistors.

In an embodiment, one of the operational amplifiers forms the first gradient and the other operational amplifier forms the second gradient.

In a further embodiment, the compensation circuit may include at least a first comparator, a first multiplexer, a second comparator and a second multiplexer that are connected in series. The setpoint value of the current and a predefinable limit value are present at the inputs of the first comparator and of the first multiplexer. The first multiplexer switches between the limit value and the setpoint value depending on the output of the first comparator. The output of the first multiplexer and the inverted limit value are present at the inputs of the second comparator. The inverted limit value and the output of the first multiplexer are present at the inputs of the second multiplexer. The second multiplexer switches between the inverted limit value and the output of the first multiplexer depending on the output of the second comparator. The output data of the second multiplexer are multiplied by a first gradient and added to the controller data signal in the summer to form the modulator input signal.

In a further embodiment, the series connected first comparator, the first multiplexer, the second comparator and the second multiplexer are present twice and are connected in parallel with one another. The outputs of the two second multiplexers are input to the summer after multiplication by the first and the second gradient, respectively.

In one embodiment, the circuit arrangement includes a differential advance control that is connected in parallel with the controller and the input of which is input by the setpoint value of the current and the output of which is connected indirectly to an input of the summer.

In a further embodiment, the circuit arrangement includes a multiplication element, that is connected between the summer and the modulator and is configured to compensate for changes in an uncontrolled supply voltage of the output stage.

In an embodiment, a method is provided for generating a current controlled by closed and open loop control for an inductive load. The method includes generating the current from a supply voltage by a switched output stage. The supply voltage of the output state is modulated depending on a modulator input signal of a modulator. The actual value of the current is determined. A controller signal is generated depending on a predefined setpoint value of the current and the actual value of the current. At least one advance controlling nonlinear compensation control signal is generated from the setpoint value of the current that compensates for nonlinearities of the output stage. The modulator input signal is generated by addition of the controller signal and the at least one compensation control signal.

In an embodiment, the compensation control signal is in each case linear between determined knee points of the setpoint value of the current and is constant starting from the last knee point.

In a further embodiment, the compensation control signal is linear with a first gradient between zero and the first knee point, is linear with a second gradient between the first knee point and the second knee point and is constant starting from the second knee point.

In a further embodiment, the knee points and the gradient at the knee points may be determined from a previously measured profile of the current at a frequency of the setpoint value of less than 5 Hz (=static output stage characteristic curve).

In a further embodiment, the knee points may be determined by comparison with a reference curve and the gradients may be determined by a linear regression.

The compensation control signal may compensate for the nonlinearities of the output stage that are caused by semiconductor forward voltages, by safety times during the switching of switching elements and by nonlinear switching properties of the switching elements.

The scope of the present invention is defined solely by the appended claims and is not affected to any degree by the statements within this summary. The present embodiments may obviate one or more of the drawbacks or limitations in the related art.

BRIEF DESCRIPTION OF THE FIGURES

FIGS. 2A-2K depict circuit diagrams with the current flows through a modulated output stage of a gradient amplifier according to an embodiment.

FIG. 8 depicts a circuit diagram of an analog circuit arrangement of an advance controlling compensation device according to an embodiment.

FIG. 9 depicts a block diagram (schematic entry) of a limiter circuit of a digital advance controlling compensation device according to an embodiment.

DETAILED DESCRIPTION

Power output stages of a gradient amplifier include at least one switched power bridge circuit. The modulation principle of such an output stage is described below.

Figure 1:
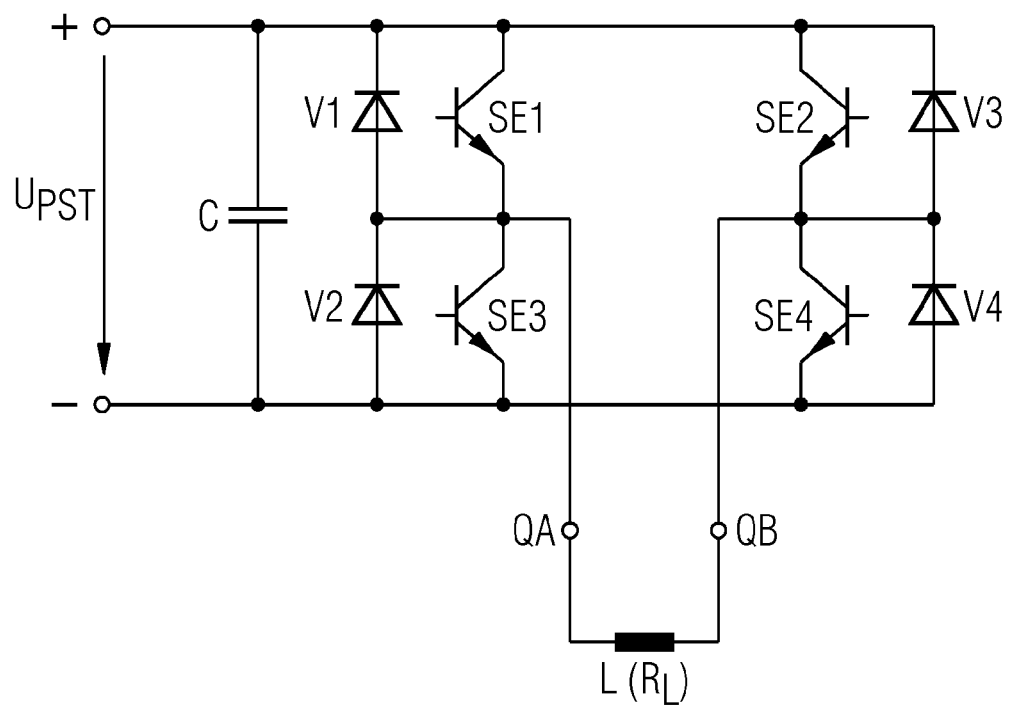
FIG. 1 depicts a circuit diagram of a switched output stage of a gradient amplifier according to an embodiment.

FIG. 1 depicts a circuit diagram of an output stage of a switching gradient amplifier. FIG. 1 includes the switching elements SE1 to SE4 (symbolized by an NPN transistor), the freewheeling diodes V1 to V4 connected in parallel with the switching elements SE1 to SE4, and a capacitor block C. The output stage is supplied with a supply voltage UPST via the terminals "+" and "−". The output stage has the outputs QA and QB, to which an inductive load L, for example a gradient coil, is connected. The load L has the resistance RL composed of the coil resistance and the resistances of the gradient lines and of the gradient filter. The control input of the switching elements SE1 to SE4 is connected to a driver circuit (not illustrated) that obtains the driving in a potential free manner of a modulator device (not illustrated).

If a plurality of individual output stages according to FIG. 1 are connected in series, as specified for example in the published patent application DE 198 57 525 A1, the supply voltage UPST is configured in a potential free (floating) manner.

A constant current may flow from the terminal QA to the terminal QB through the gradient coil L. In the case of a modulation in accordance with DE 198 57 525 A1, successive switching states occur in an operating cycle. The switching state of the switching elements SE1 to SE4 is depicted by the circle symbol. A filled circle implies that the switching element is switched on, a ¾ filled circle implies that the switching element is switched on with zero current, and an empty circle implies that the switching element is switched off.

Figure 2A:
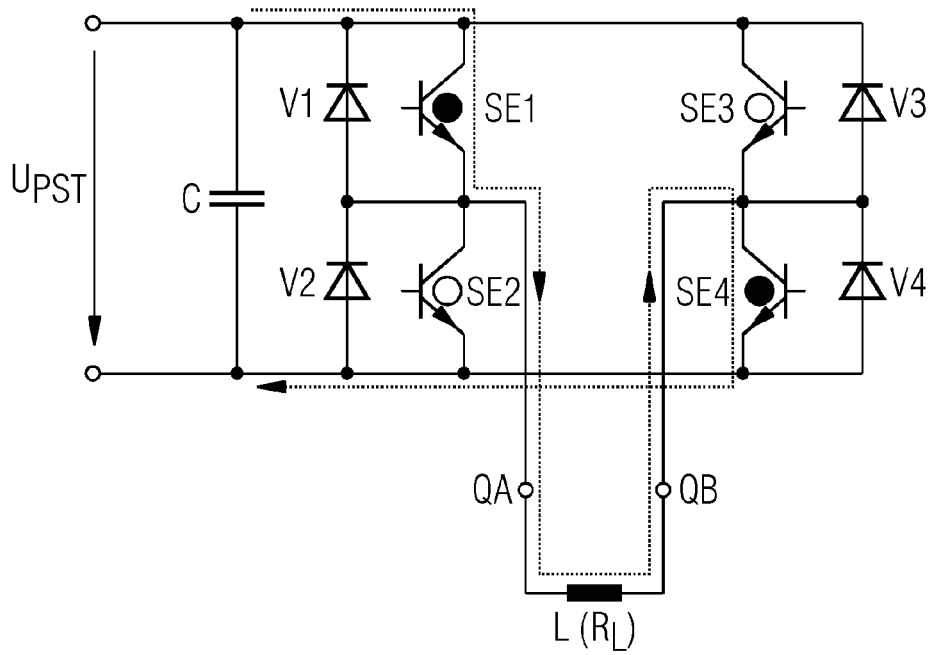

In FIG. 2A, the switching elements SE1 and SE4 are switched on, and a current flows from the "+" pole of the supply voltage UPST through the switching element SE1, through the load L and through the switching element SE4 to the "−" pole of the supply voltage UPST, that is designated by "current build-up plus".

Figure 2B:
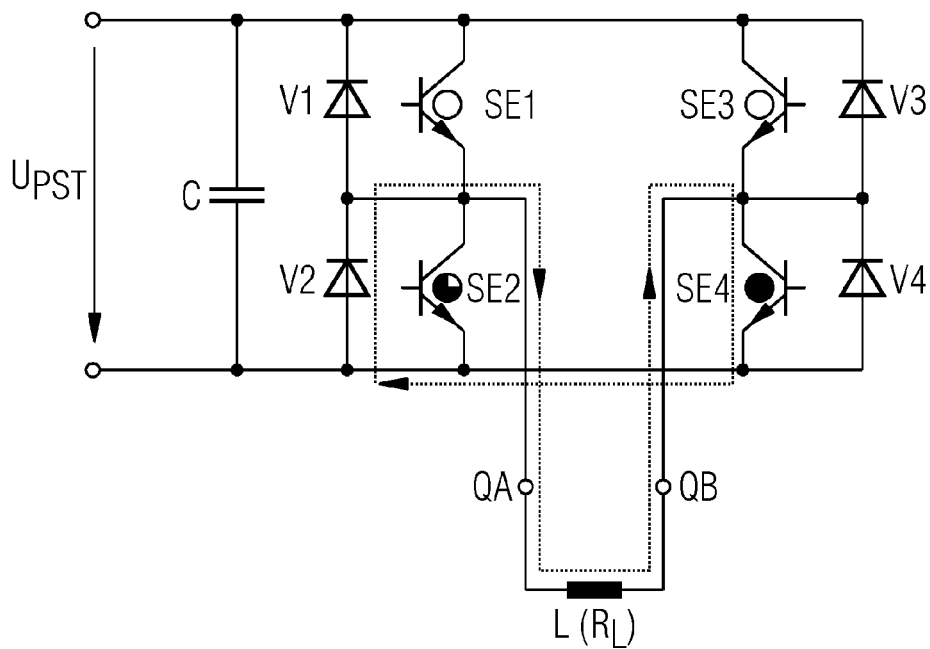

In FIG. 2B, by comparison with FIG. 2A, the switching element SE1 is switched off and the switching element SE2 may be switched on, but does not carry current. The current flows, in a manner driven by the inductance of the load L, from the terminal QB via the switching element SE4, the freewheeling diode V2 to the terminal QA and thus forms an electrical circuit, that is designated by "lower freewheeling circuit plus".

Figure 2C:
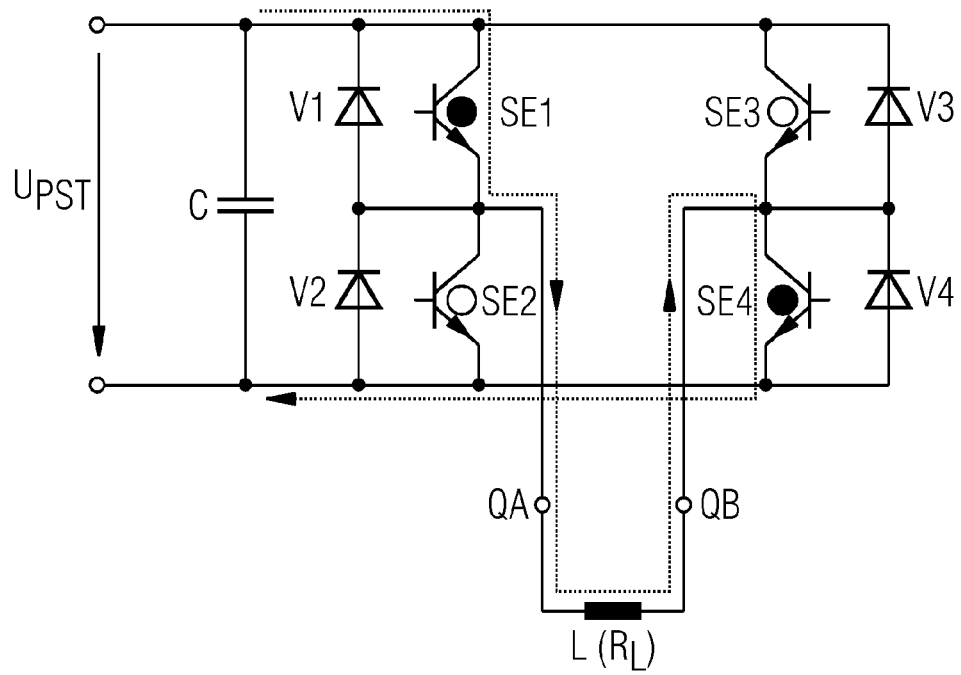

In FIG. 2C, by comparison with FIG. 2B, the switching element SE2 is switched off since the switching element SE1 is switched on again. The switching state according to FIG. 2C corresponds to the switching state according to FIG. 2A ("current build-up plus").

Figure 2D:
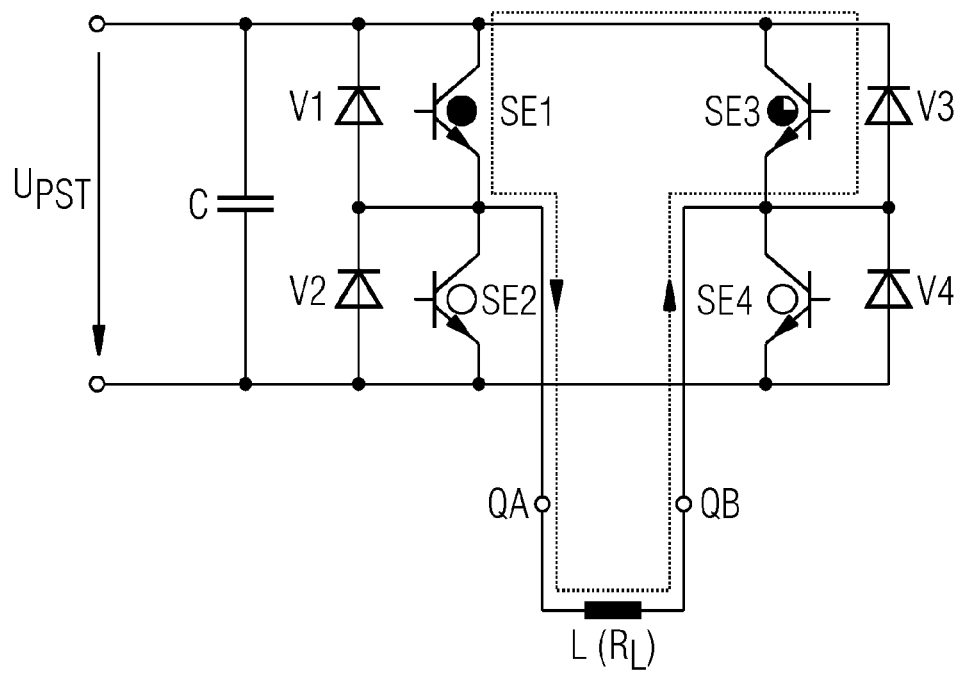

In FIG. 2D, by comparison with FIG. 2C, the switching element SE4 is now switched off and the switching element SE3 is (may be) switched on, but does not carry current. The current flows, in a manner driven by the inductance of the load L, from the terminal QB via the freewheeling diode V3, the switching element SE1 to QA and thus in the circuit, that is designated as "upper freewheeling circuit plus". As a result of a change in the switching states in accordance with FIG. 2D to FIG. 2A, the next operating cycle begins.

If current flows through one of the freewheeling diodes V1 to V4 in a switching state, the switching element S1 to S4 in parallel with the freewheeling diode V1 to V4 does not need to be switched on at high current, since the switching element does not carry current. With sufficiently high current, the switching elements S1 to S4 identified with ¾ circle may be left switched off. In the case of low currents, by contrast, all the switching elements S1 to S4 must be switched since a detection of the current actual value is effected with a delay and may furthermore have an offset. A fast change in the current direction may be identified too late as a result of the delay and, owing to the lack of driving of the required switching elements, a momentary pause at current zero may occur, or, as a result of the offset, the change in the current direction may not be noticed and, as a result, the output stage may operate only in one current direction.

Moreover, the current must be high enough for switching off unrequired switching elements since, in the case of excessively low currents, an effect on the generated output voltage may become discernible.

Only a low voltage is required for maintaining the current, since the resistance RL is very low. Within an operating cycle, therefore, the switching states "current build-up plus" are present only momentarily, while in contrast predominantly "upper freewheeling circuit" and "lower freewheeling circuit" are driven.

Figure 2E:
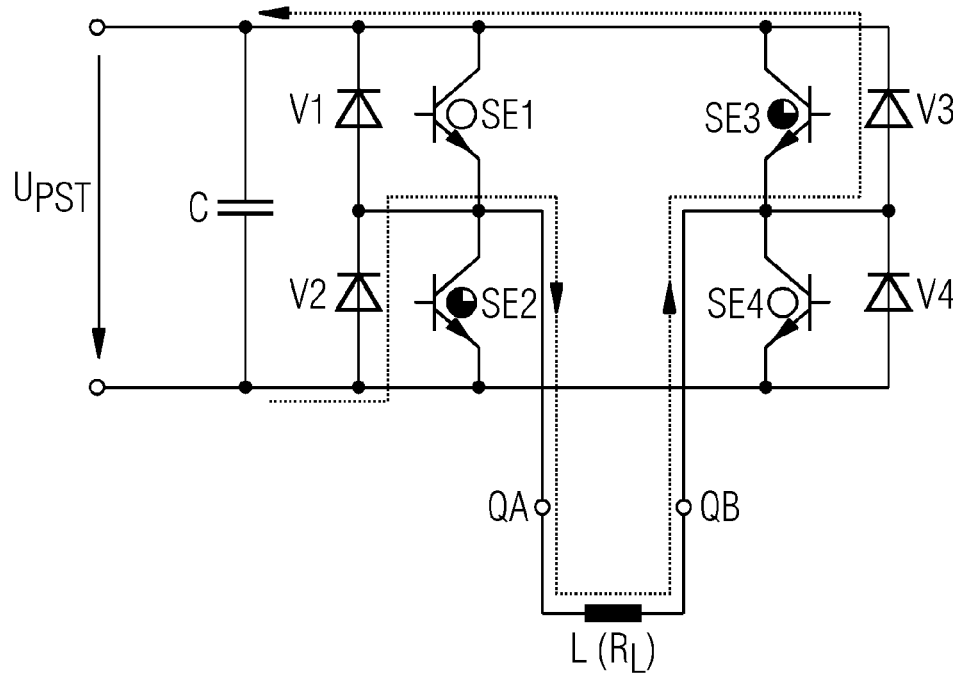
Figure 2F:
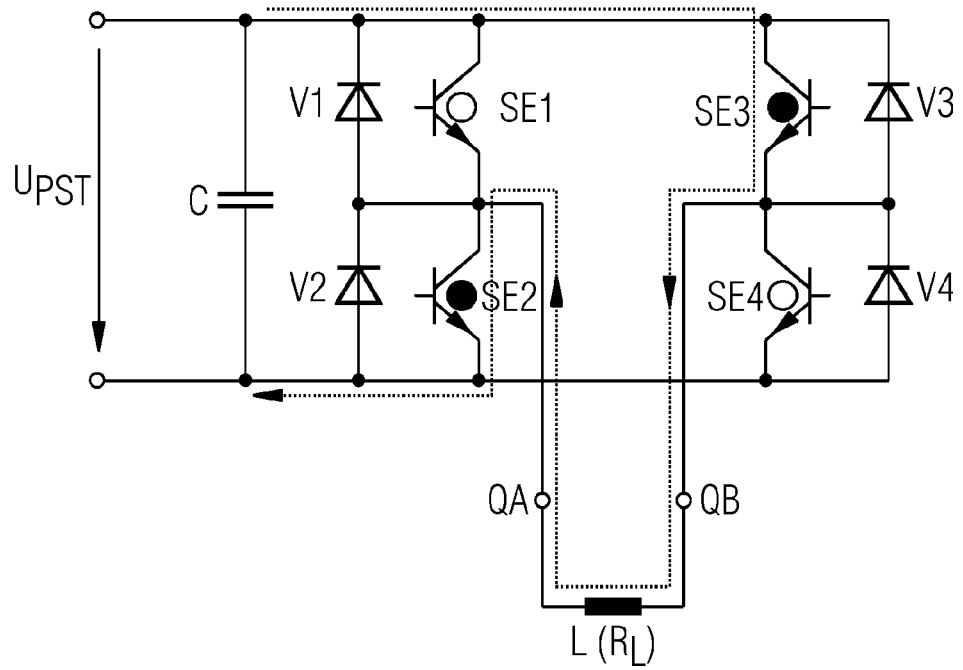
Figure 2G:
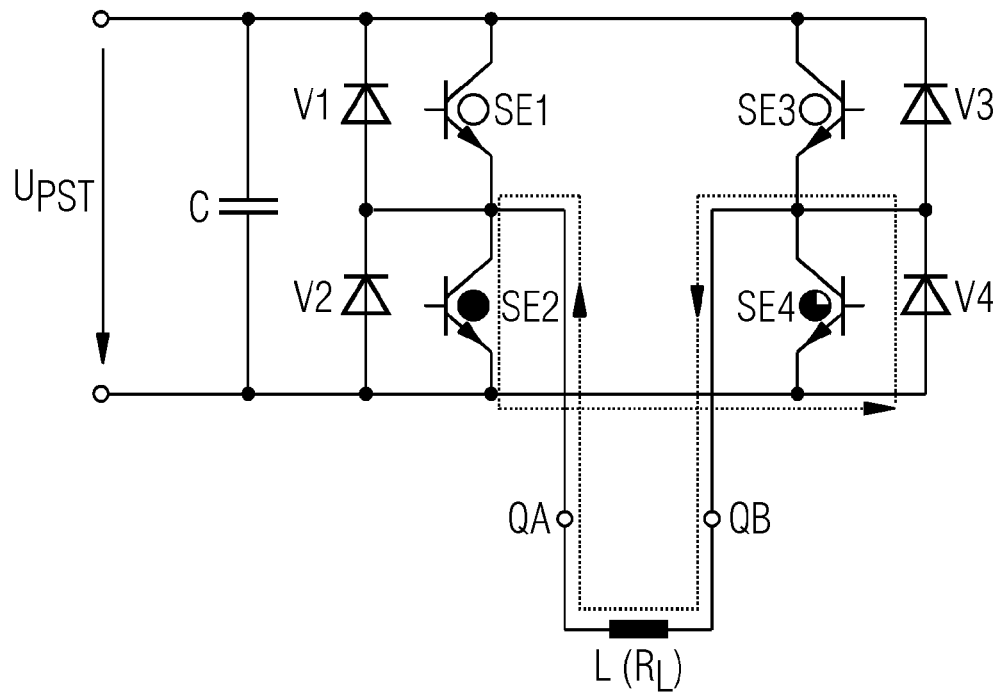
Figure 2H:
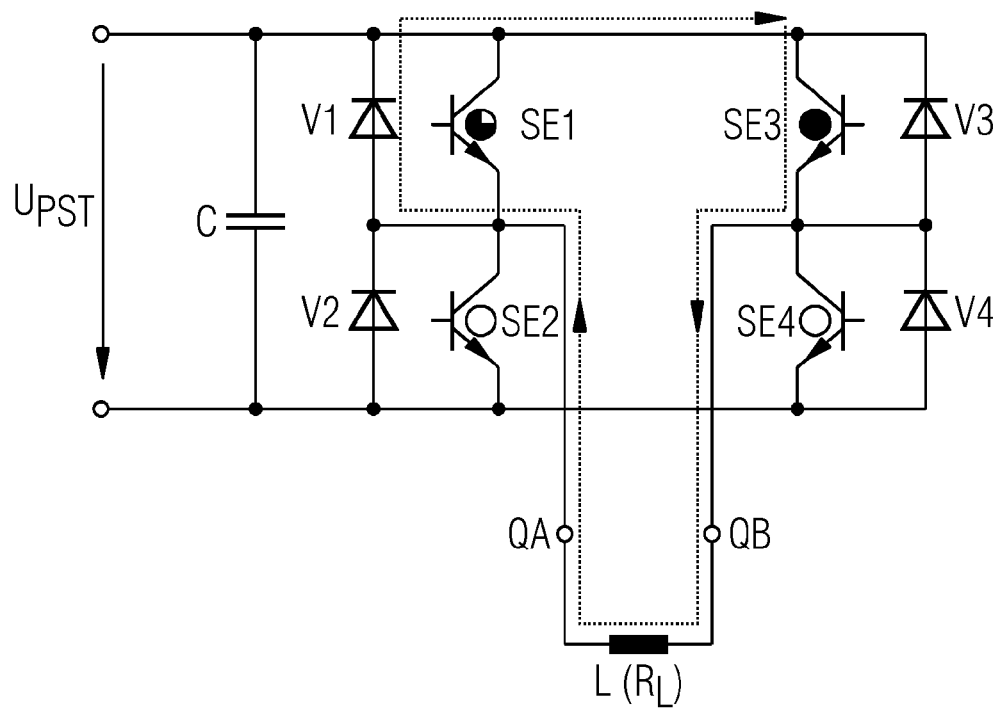

If a current in the opposite direction is maintained or built up, then the operating cycle includes the following switching states: in accordance with FIG. 2F with "current build-up minus", in accordance with FIG. 2G with "lower freewheeling circuit minus", in accordance with FIG. 2F with "current build-up minus" and in accordance with FIG. 2H with "upper freewheeling circuit minus" and further in accordance with FIG. 2F.

If a current is intended to be rapidly reduced, the output stage must generate a back-EMF since the load L is an inductance. In FIG. 2E, the current flows in the positive direction out of the terminal QA through the load L to the terminal QB. The current flows via the freewheeling diodes V2 and V3 into the capacitor block C and feeds energy back into the capacitor block C. The switching elements SE2 and SE3 may be switched on, but have zero current in any case designated by "current reduction plus".

Figure 2I:
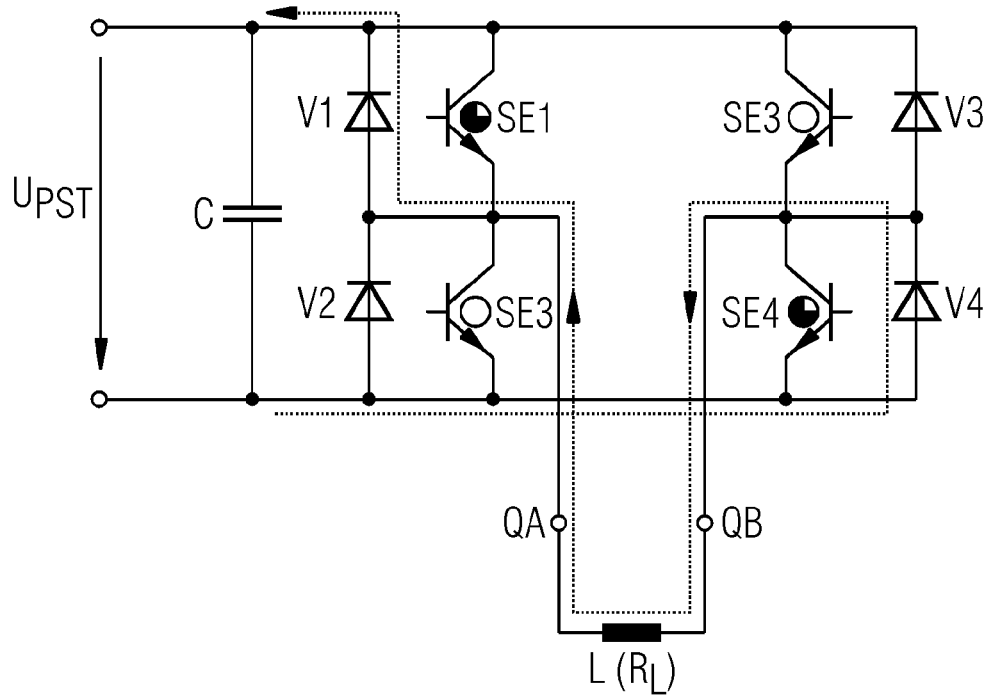

In FIG. 2I, the current flows in the negative direction from the terminal QB through the load L to the terminal QA. The current flows from the capacitor block C via the freewheeling diode V4 to the terminal QB, through the load L to the terminal QA and via the freewheeling diode V1 into the capacitor block C and feeds energy back into the capacitor block C. The switching elements SE1 and SE4 may be switched on, but have zero current designated by "current reduction minus".

If current in the positive direction is maintained and intended to be subjected to polarity reversal with a high edge steepness into a current in the negative direction and be maintained, the following switching states hold true.

Maintaining current in positive direction: FIG. 2A-FIG. 2B-FIG. 2A (=FIG. 2C)-FIG. 2D-FIG. 2A-FIG. 2B—etc.

Reduction from positive direction with energy uptake into the capacitor block C: FIG. 2E-FIG. 2D-FIG. 2E-FIG. 2B-FIG. 2E [current zero crossing]-FIG. 2F.

Current build-up in negative direction: FIG. 2H-FIG. 2F-FIG. 2G-FIG. 2F-FIG. 2H—etc.

Maintaining current in negative direction: FIG. 2F-FIG. 2G-FIG. 2F-FIG. 2H.

An underlined switching state may have a long duration in the operating cycle. The switching state according to FIG. 2E transitions seamlessly into the switching state according to FIG. 2F, for example, that these switching states are identical. Mutually corresponding switching states are those according to FIG. 2A, FIG. 2C, and FIG. 2I, those according to FIG. 2E and FIG. 2F, those according to FIG. 2B and FIG. 2G, and those according to FIG. 2D and FIG. 2H.

Figure 2K:
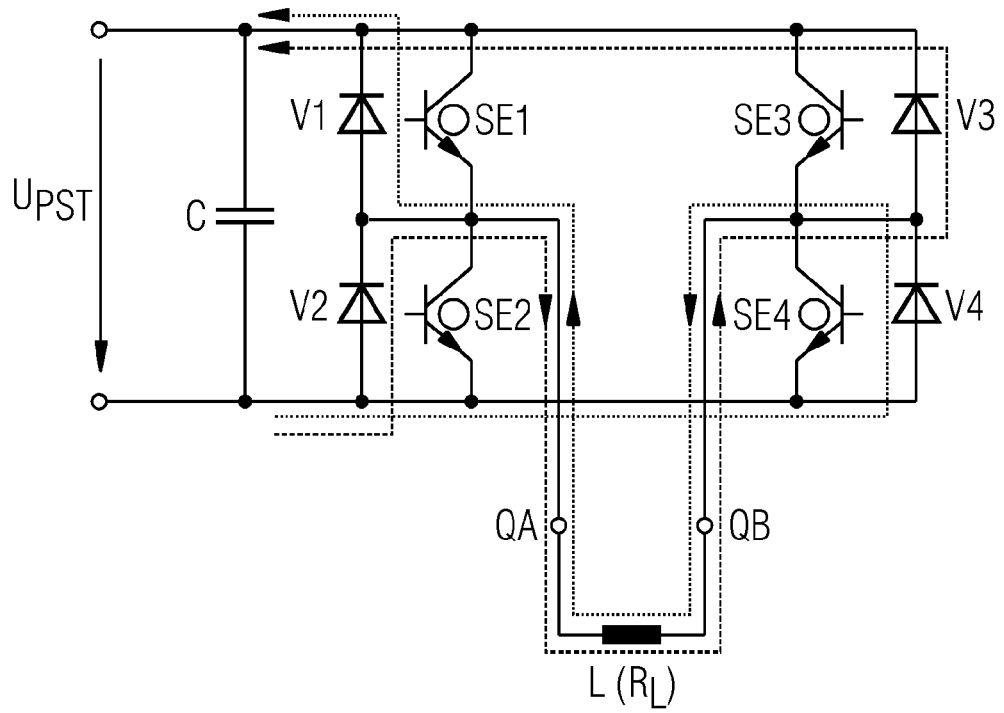

A further switching state is depicted in FIG. 2K. All the switching elements SE1 to SE4 are switched off. A current flowing in an arbitrary direction through the load L flows in the output stage through in each case two freewheeling diodes and charges the capacitor block C until no more current flows. In a manner comparable with the switching states according to FIG. 2I and FIG. 2E, the maximum back-EMF is present at the load L.

The origin of the nonlinearities is described below. The nonlinearities may be caused by the current carrying semiconductor switching elements, the safety times in driving and by the change in the switching elements as a result of the current direction and as a result of the modulation method.

The switching states prevailing during operation are the "upper freewheeling circuit" and the "lower freewheeling circuit", as illustrated e.g. in FIG. 2B, FIG. 2D, FIG. 2G, and FIG. 2H. The current of each output stage flows through a freewheeling diode and a semiconductor switching element, for example a switched-on transistor. Both types of components exhibit a nonlinear behavior, e.g. the voltage drop across the components is not proportional to the current. By contrast, the resistance RL of the load L is a linear component since the voltage across the resistance rises proportionally to the current. The inductance of the load L is a frequency dependent linear component, e.g. for the same frequency current and voltage are proportional to one another.

In a series connection including n output stages, as described in the published patent application DE 198 57 525 A1, the current thus flows through n freewheeling diodes and n switched-on switching elements as nonlinear components in the freewheeling circuits. For n=5, a current of 50 A, a voltage drop across the freewheeling diode of 0.7 V, a voltage drop across the switching element (for example an IGBT) of 1 V and a resistance RL of 0.2 ohm, the voltage drop across the resistance RL is 10 V. The voltage drop across the nonlinear components in total is 8.5 V. The output stage must therefore be driven with a modulation for 18.5 V (averaged over an operating cycle) in order that 10 V is obtained at the load L and the remainder is left "stuck" at the nonlinear components in the output stage. The semiconductors in the output stage have a considerable influence on the linearity.

FIG. 1 depicts where the switching elements SE1 and SE2 are situated directly between the supply voltage UPST. The two switching elements SE1 and SE2 must never be switched on simultaneously since otherwise the switching elements SE1 and SE2 would be destroyed by the short circuit current or shunt current. Therefore, in the driving by the modulator for the change in the driving, e.g. from the switching element SE1 to the switching element SE2, safety times are provided that delay the switching-on. The driving of the switching element SE1 is first turned off before the switching element SE2 obtains driving for switching on.

The modulator may initially operate linearly. For a voltage of zero, the modulator drives the output stage alternately to the "upper freewheeling circuit" and the "lower freewheeling circuit" (e.g. FIG. 2B and FIG. 2D). As soon as a low output voltage is intended to be generated, the driving in accordance with FIG. 2A is interposed between this alternation.

With safety times, by contrast, the driving for a voltage of zero is given by: FIG. 2B-FIG. 2K-FIG. 2D-FIG. 2K-FIG. 2B etc. If a current has flowed, then the current is rapidly reduced by the switching state according to FIG. 2K. As a result, there may be a dead region for instances of driving around zero. However, that may not be the case. A switching transistor with zero current, e.g. an IGBT, may remain in the switched-on state for a relatively long time after removal of the driving because, e.g. in the case of an IGBT, the base thereof is "flooded" with charge carriers, but this charge may not be reduced rapidly by a corresponding collector current. As soon as the transistor carries current, however, the charge is reduced. If the current through the load L is zero, the IGBT is switched off as a result of the switching-on of the opposite transistor and the momentary shunt current that occurs as a result. In the case of a current and a driving of zero, there is thus indeed the change to FIG. 2B and FIG. 2D. By increasing current through the load L, the switching-off of the switching transistor becomes faster, in the IGBT the base charge is reduced by the load current, and, as a result, when there is a current through the load L that differs significantly from zero that there is the occurrence of a driving gap that increases with the current as a result of the safety time.

Under the assumption that the current is intended to be subjected to polarity reversal with a(n) (almost) maximum rate of voltage rise, then e.g. upon the change from a positive to a negative current direction in accordance with the above example the instances of driving according to FIG. 2E and FIG. 2F predominate. While in FIG. 2E current is input back into the capacitor block C via the freewheeling diodes V2 and V3, in FIG. 2F current is drawn from the capacitor block C via the switching elements SE2 and SE3. In the case of FIG. 2E, the magnitude of the voltage across the load L is equal to UPST+U(V2)+U(V3), whereas in the case of FIG. 2F it is equal to UPST−U(SE2)−U(SE3).

At the current zero crossing, therefore, the magnitude of the load voltage changes overall by 2 diode forward voltages and 2 switching transistor saturation voltages. With the values from above, the difference would be equal to 2*0.7 V+2*1 V=3.4 V. If UPST has 400V, then the nonlinearity is negligibly small in comparison with the nonlinearity assessed above in the case of current-carrying semiconductor switching elements. In the case of a series connection of n output stages, there are also n times as many semiconductors participating in this nonlinearity, but in turn the total voltage of the output stage is also n times as high, as a result of which there is no change to this proportional ratio.

Figure 3A:
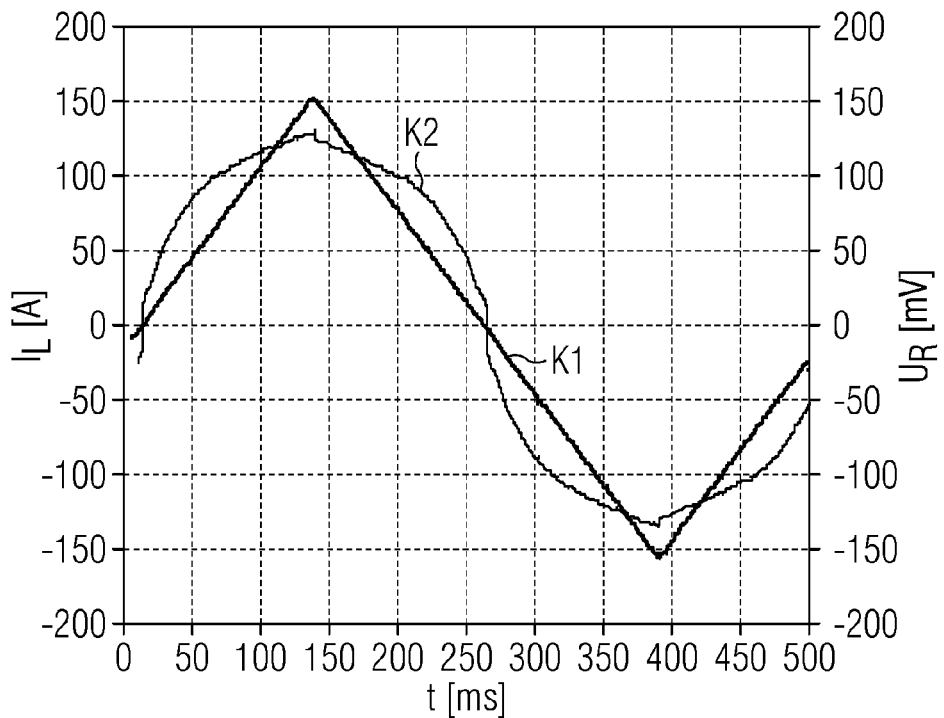
FIGS. 3A and 3B depict graphs of the current through a load of a controlled output stage and the controller voltage according to an embodiment.
Figure 3B:
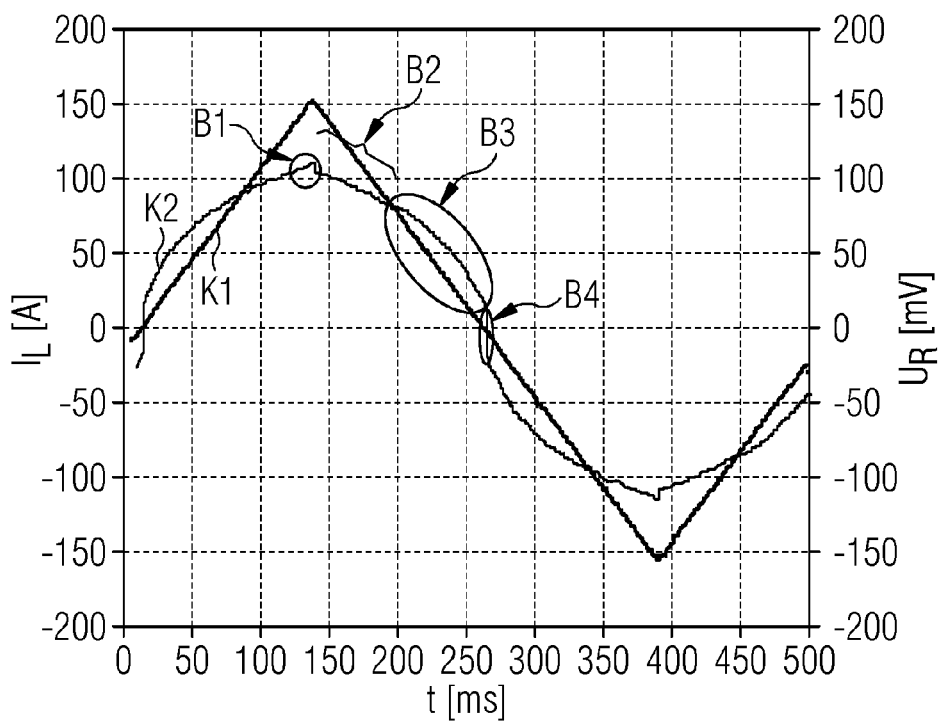

The linearity distortions are described below. The greatest distortions of linearity occur according to the above description as a result of the voltage drops at the semiconductors through which current flows in the freewheeling circuit, and as a result of the required safety times. By way of example, FIG. 3A and FIG. 3B illustrate measured distortions in a graph. Time tin ms is plotted horizontally, and the current intensity I in A and the controller voltage UR in mV are plotted vertically. Curve K1 depicts the current IL through the load L. A slow triangular current at 2 Hz is denoted. Curve K2 depicts the control voltage UR.

In order to clarify the influence of the safety time, a safety time of 480 ns is set in FIG. 3A, and of 420 ns in FIG. 3B. The current IL is generated by the predefinition of a corresponding setpoint value NV in controlled operation. Although the signal frequency at 2 Hz is very low, nevertheless a jump caused by the change in current and the inductance of the load L may be seen in the region B1 in FIG. 3B. This jump therefore has nothing to do with a nonlinearity.

In FIG. 3B, a rectilinear profile of the control voltage characteristic curve K2 may be seen in the region B2. The gradient in the section corresponds to the resistance RL of the load L. Through a comparison of FIG. 3A with FIG. 3B, the region B3 depicts that the influence of the safety times and of the IGBT switching behavior is evident. The region B4 is determined by the semiconductor voltages in the freewheeling circuits.

Figure 4:
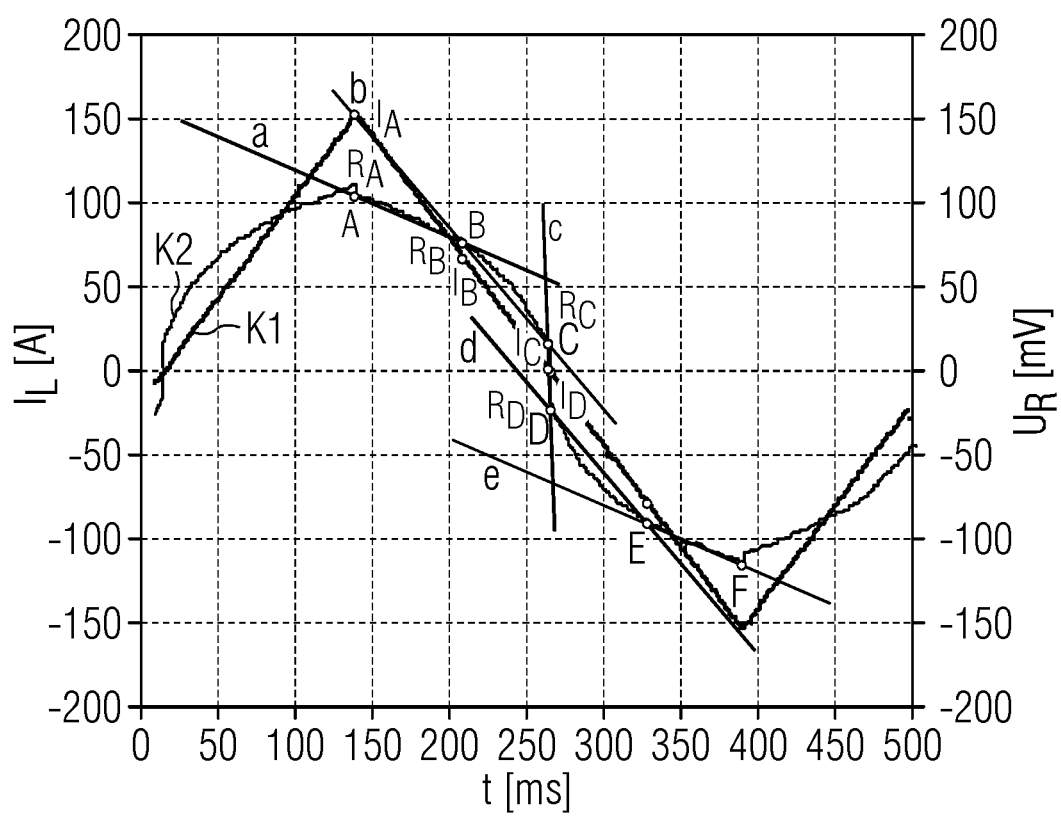
FIG. 4 depicts a graph of the current through a load of a controlled output stage and the controller voltage with a linear approximation of the controller voltage according to an embodiment.

A description is given below, with reference to the graph in FIG. 4, of how the linearity distortions are compensated for. The graph in FIG. 4 depicts the signal profiles from FIG. 3B. It is attempted to approximate the profile of the controller voltage UR (characteristic curve K2) with straight lines a to e. The straight line a passes through the points A and B. The straight line b passes through the points B and C. The straight line c passes through the points C and D. The straight line d passes through the points D and E. The straight line e passes through the points E and F. The straight line d is a parallel shifted straight line b. The straight line e is a parallel shifted straight line a. Each point A to F is assigned a controller voltage value and a point in time on the time axis t. Each point in time of the time axis t is assigned a current IL or a current actual value of the curve K1.

A is characterized by the controller voltage RA. At the point in time of A, the current IA appears. B is characterized by the controller voltage RB. At the point in time of B, the current IB occurs. C is characterized by the controller voltage RC. At the point in time of C, the current IC occurs. D is characterized by the controller voltage RD. At the point in time of D, the current ID occurs; etc.

The gradients a1, b1, c1 . . . are calculated from the difference controller voltages and the difference currents. A1=(RA−RB)/(IA−IB), b1=(RB−RC)/(IB−IC), c1=(RC−RD)/(IC−ID). Alternatively, {(|RC|+|RD|)/2}/IC, e.g. for half the sum or average value of the magnitudes of RC and RD, to be divided by IC. The inductance of the load L causes the shift of the region B1 in FIG. 3B.

In the graph in FIG. 4 of the controller voltage UR (curve K2) at the output of the controller (Y-axis) plotted against the current I through the load L (X-axis), the gradient a1 corresponds to the gradient brought about by the resistive portion RL of the load L. The gradient b1 corresponds to a gradient brought about by resistive portions RL of the load L and the safety times (and switching properties). The gradient c1 corresponds to a gradient brought about by resistive portions RL of the load L, safety times and the semiconductor voltages.

The gradients b1K and c1K brought about by safety times and semiconductor voltages alone are obtained by subtraction as follows: b1K=b1−a1 (=gradient as a result of safety times alone) and c1K=c1−b1K−a1=c1−b1 (=gradient caused by the semiconductor voltages).

Figure 5:
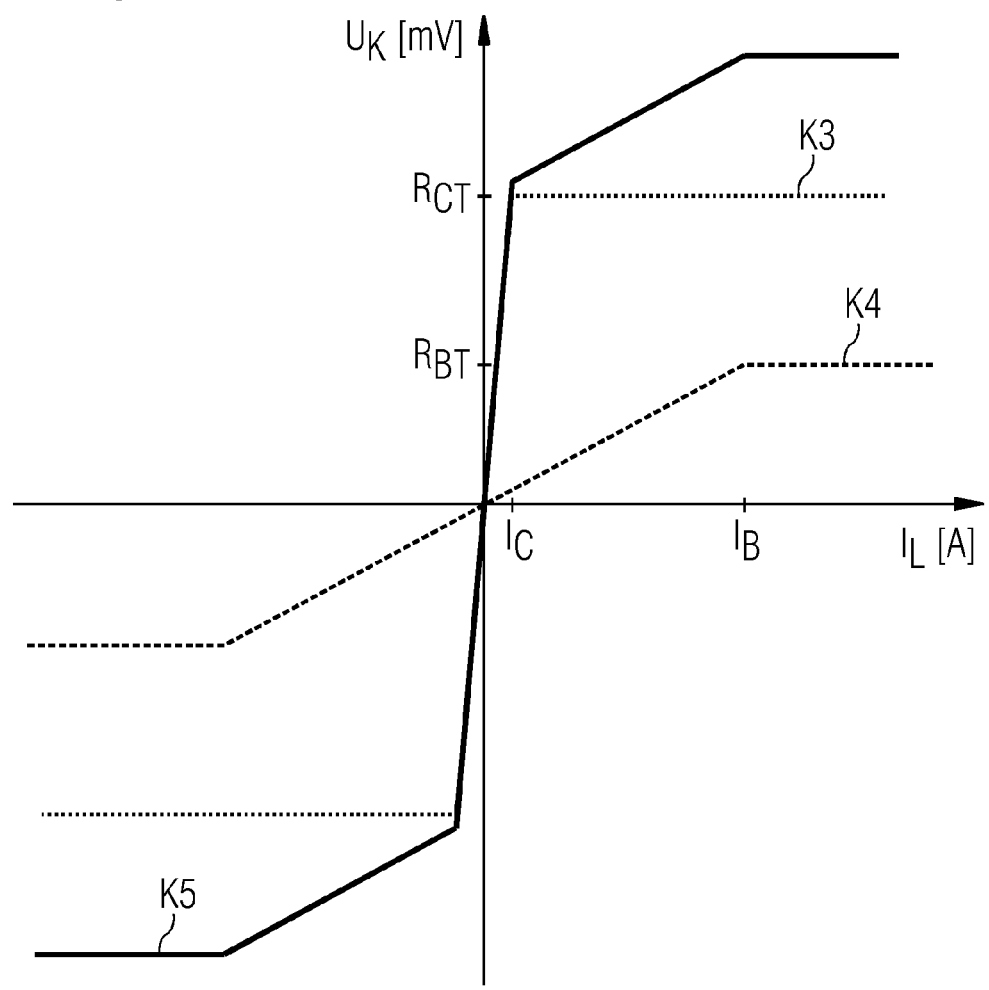
FIG. 5 depicts a graph of the compensation control voltage versus the current actual value according to an embodiment.

A graph may be determined with compensation characteristic curves, as depicted in FIG. 5. The X-axis indicates the current IL through the load L, and the Y-axis represents the voltage of the compensation control signal UK. The characteristic curve K3 is depicted by a dotted line, and the curve rises from zero with the gradient c1K up to the current +/−IC and remains constant starting from +/−IC at the value +/−RCT. RCT is the maximum compensation voltage portion for compensating for the semiconductor forward voltages. The characteristic curve K4 is depicted by a dashed line, and the curve rises from zero with the gradient b1K up to the current +/−IB and remains constant starting from +/−IB at the value +/−RBT. RBT is the maximum compensation voltage portion for compensating for the influences of the safety times and of the switching properties. The characteristic curve K5 is illustrated by a solid line and it results from the sum of the dotted and dashed characteristic curves K3 and K4. The characteristic curve K5 has knee points at +/−IC and +/−IB.

For each current IL, the voltage of the compensation control signal UK is added artificially to the controller voltage UR generated by a control device RE, and the voltage is determined from the characteristic curve K5. As a result, the nonlinearities as a result of the semiconductor forward voltages and the delay times may be compensated for by the artificially added voltage. As a result, the controller voltage UR output by the controller device RE is determined by the load L.

For a compensation device NLC, the current actual value AV is determined if the value is the correct input signal. If the drive signal of the output stage PST is derived from the current IL through the load L, the temporal relationship may be reversed since the output stage PST generates a voltage and the current IL through the load L flows through the voltage. Furthermore, the positive feedback in the case of overcompensation may lead to an instability. If the output stage PST generates a voltage across the load L, then there is a current flow, that however, for its part, via the compensation device NLC, may increase the driving of the output stage PST, that may lead to a higher output voltage and thus to a higher current IL, that may in turn increase the driving of the output stage PST and so on.

Figure 6:
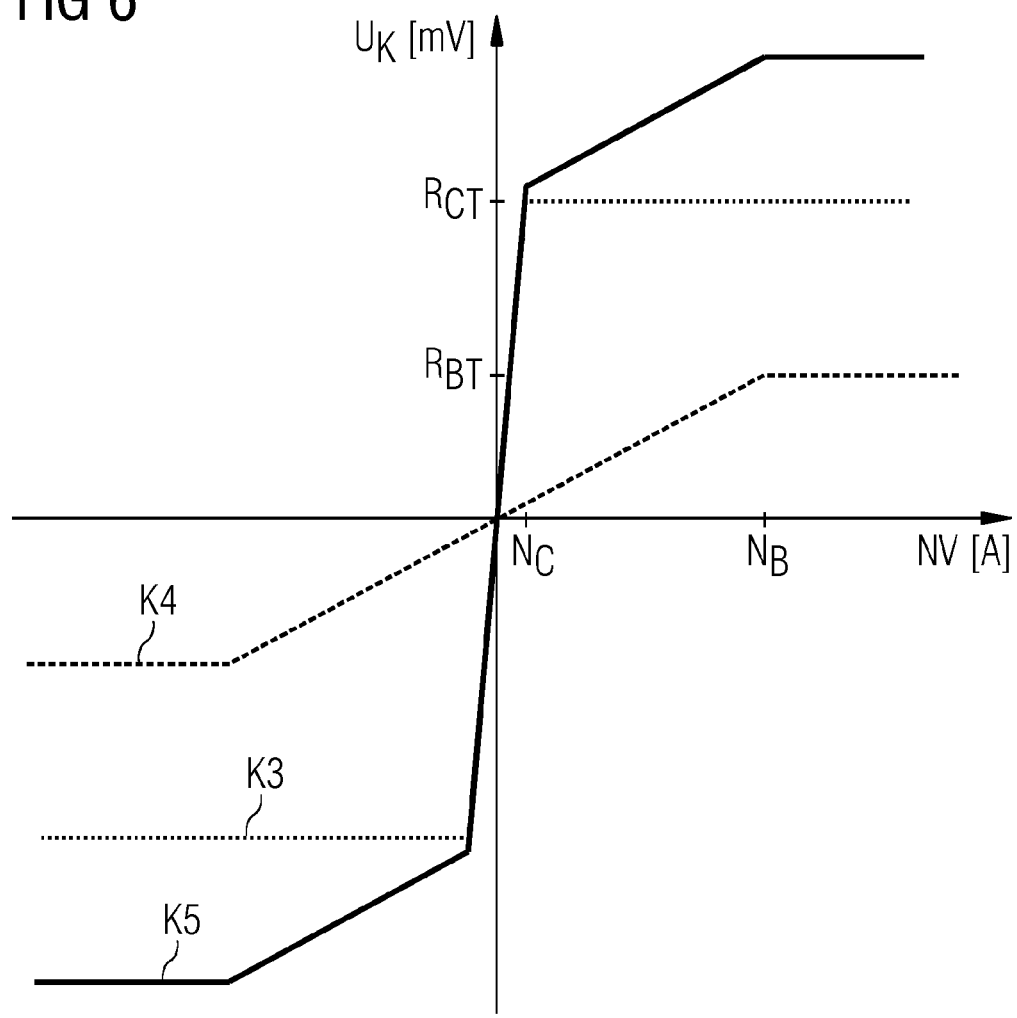
FIG. 6 depicts a graph of the compensation control voltage versus the current setpoint value according to an embodiment.

The temporal relationship of cause effect is correct again, however, if, instead of the actual value AV of the current IL, the setpoint value NV is taken as input variable of a compensation device NLC. As a result, the compensation device NLC is operated as an "advance control". The change in the X-axis from the actual value AV of the current IL to the setpoint value NV is shown by the graph in FIG. 6. FIG. 6 is identical to FIG. 5, merely with the actual value AV of the current IL is replaced by the setpoint value NV (nominal value) of the current IL (IB replaced by NB and IC replaced by NC).

A straight line with the gradient corresponding to a1, e.g. corresponding to the resistance RL of the load L, may additionally also be added to the characteristic curve K5 according to FIG. 6. However, the resistance RL is linear and poses no problem for the controller device RE. While the compensation of the safety times and of the semiconductor forward voltages concerns an amplifier property, the resistance RL is a property of the gradient coil, for example. Consequently, the compensation is reconfigured if the amplifier were operated with different gradient coils.

Figure 7:
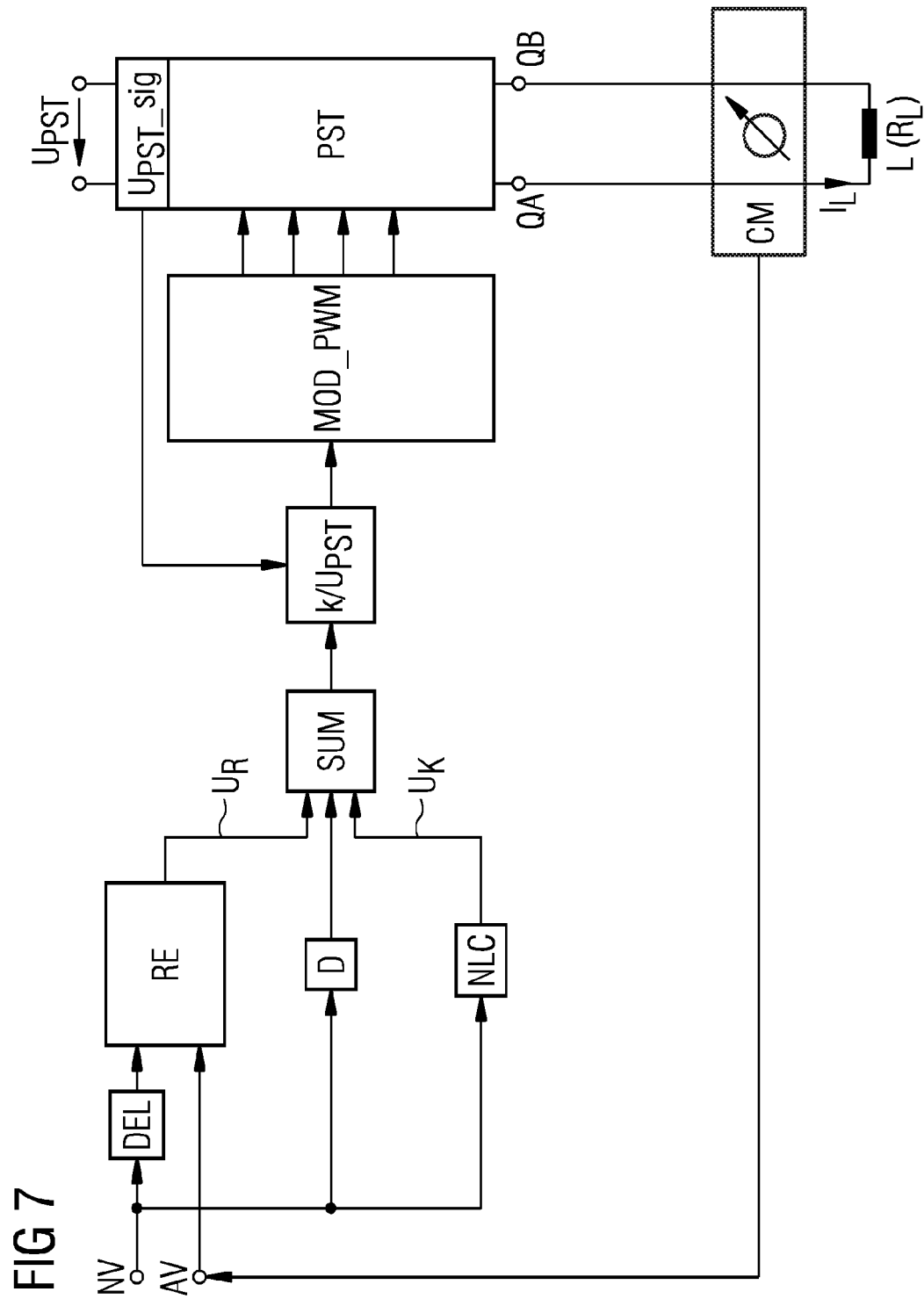
FIG. 7 depicts a block diagram of a controlled output stage of a gradient amplifier according to an embodiment.

FIG. 7 depicts, in a block diagram, an overview of a gradient amplifier with compensation of the nonlinearities. The gradient amplifier is driven with the setpoint value NV of the current IL through the load L. The setpoint value NV passes via the delay element DEL to the controller device RE (e.g. a PI controller). The setpoint value NV is input to the differential advance control by the D component D. The delay element DEL and the differential advance control D are described in the published patent application DE 198 56 800 A1. The setpoint value NV is input to the compensation device NLC (Nonlinearity Compensation). The outputs of the controller device RE, of the differential advance control D and of the compensation device NLC are added in the summer SUM. The output of the summer SUM is input to a pulse width modulator MOD_PWM as a modulator device.

In the case of an uncontrolled supply voltage UPST of the output stage PST the output signal of the summer SUM is input to the pulse width modulator MOD_PWM via the multiplication element k/UPST. A measurement of the output stage voltage UPST_SIG that is input to the element k/UPST is carried out in the output stage PST. At the output of the element k/UPST, the output signal of the summer SUM is multiplied by k/UPST, such that, for example in the case of a halving of the output stage voltage UPST_SIG, the output signal of the element k/UPST—and thus the modulation swing—assumes the doubled value. With regard to the voltage feedback and with regard to the element k/UPST, the details may be found in the published patent application DE 103 53 965 A1.

The pulse width modulator MOD_PWM generates the pulse width modulation for the output stage PST. The load L, a gradient coil, is connected to the outputs QA and QB of the output stage PST via the current measuring device CM (current measure). The current measuring device CM, with an actual value amplifier, generates the actual value AV of the current IL, that is input to the control device RE, whereby the control loop is closed.

FIG. 8 depicts a circuit diagram of an analog circuit for compensating for the nonlinearities. The operational amplifier J3 with the resistors R5 to R9 forms the summer SUM in accordance with FIG. 7, the resistors R5 and R6 are also part of the compensation device NLC, that additionally has the resistors R1 to R4, the operational amplifiers J1 and J2 and the zener diodes Z1 to Z4. The operational amplifier J1 is configured for compensating for the semiconductor forward voltages.

The Zener diodes Z1 and Z2 connected back-to-back in series have the effective Zener voltage UZF composed of the actual Zener voltage UZ and a forward voltage UF. Starting from the setpoint value NC, the output voltage is limited by the Zener diodes Z1 and Z2. The following thus results: UZF/NC=R2/R1, with either the resistor R1 or the resistor R2 predefined.

The operational amplifier J2 is configured for compensating for the influences of the safety times and transistor switching properties. Starting from the setpoint value NB, the output voltage is limited by the Zener diodes Z3 and Z4. The following thus results: UZF/NB=R4/R3, with either the resistor R3 or the resistor R4 predefined.

If the operational amplifier J1 has the output voltage UZF, then exclusively a voltage of RCT occurs at the output of the summer SUM: RCT/UZF=R9/R5. If the operational amplifier J2 has the output voltage UZF, then as a result of that alone a voltage of RBT occurs at the output of the summer SUM: RBT/UZF=R9/R6.

The resistors R2 and R4 (in parallel with the Zener diodes Z1 and Z2, and respectively Z3 and Z4) are selected to not have excessively high resistance, in order that no corruption occurs as a result of the residual current of the Zener diodes Z1 to Z4. The gains calculated for the operational amplifiers J1 and J2 may become very high, such that the gains are distributed among a plurality of amplifier stages. In the above example, the Zener diodes Z1 to Z4 in the operational amplifiers J1 and J2 have identical Zener voltages. The Zener diodes Z1, Z2 in the operational amplifier J1 may be selected to be different than the Zener diodes Z2, Z3 in the operational amplifier J2.

The block diagram using analog technology according to FIG. 7 may be used for digital signal processing. For example, for digital signal processing there is a voltage feedback with the element k/UPST for voltage feedback, the control device RE, the differential advance control D, the addition of the output signals of the control device RE and of the differential advance control D by an adder (summer SUM). In the same way as in the analog circuit, the outputs of the compensation device NLC are added to the other signals in the summer SUM.

In the compensation device NLC, the compensation control signals to be added in the summer SUM are generated from the setpoint value NV. From the setpoint value NV, setpoint values limited to +/−NC and +/−NB (for details concerning the setpoint values NB and NC see FIG. 6) are generated and are multiplied (e.g. "amplified") in accordance with RCT/NC and RBT/NB. The results of the multiplications are input to the summer SUM.

The limiting of the setpoint value NV is depicted in the form of a circuit diagram in FIG. 9. The circuit includes a first comparator KOM1, a first multiplexer MUX1, a second comparator KOM2 and a second multiplexer MUX2 connected in series. The setpoint value NV with a resolution of 24 bits and the limit value LIMIT with a resolution of 24 bits are input to the circuit. The limit value LIMIT has the value+NC for a first embodiment and the value+NB in a second embodiment. If the setpoint value NV rises to positive values, then the setpoint value NV at some point exceeds the limit value LIMIT, e.g. the limit value LIMIT is lower than the setpoint value NV, such that the condition "alb" (a lower b) of the first comparator KOM1 is met and the output becomes "high".

If the control input of the first multiplexer MUX1 is "low", the setpoint value NV is output unchanged by the multiplexer, but for "high" the first multiplexer MUX1 switches over to the limit value LIMIT. Consequently, no setpoint value NV higher than the limit value LIMIT may occur at the output of the first multiplexer MUX1.

Using the inverter INV, the limit value LIMIT is inverted and becomes a negative number; although the magnitude thereof is incorrect as a result of the inversion by "1", that is not important in view of the 24-bit resolution. If the setpoint value NV, and thus the output of the first multiplexer MUX1, assumes ever lower values, the setpoint value NV at some point falls below the inverted limit value LIMIT, that is then greater than the setpoint value NV. Thus, the condition "agb" (a greater b) of the second comparator KOM2 is met, the output thereof becomes "high" and the second multiplexer MUX2 will then output the inverted limit value LIMIT.

Consequently, the limited setpoint value NVLIM occurs at the output of the circuit, that value limits the setpoint value NV to the values between the positive and negative limit values LIMIT, NLIMIT. The "digital Zener diode" is present twice; the limit value LIMIT is equal to NC in the first diode and equal to NB in the second diode.

The limited setpoint values NVLIM are multiplied by RCT/NC and RBT/NB, respectively, and added in the summer SUM, as described above. The multiplication may be given precedence and then limiting carried out as (RCT/NC)*LIMIT and (RBT/NB)*LIMIT, respectively.

In FIG. 4, the points A, B, C, and D are placed on the measured characteristic curve K2. If RC is shifted slightly upward and the gradients are then determined, although the result in the region around the point C is overcompensated for somewhat, in return other sections may turn out to have better compensation. The approximation to the measured curve using straight lines is left to a user's skill or automated evaluation software (comparison with a reference curve and linear regression).

In the example depicted, the measured characteristic curve K2 is divided into two compensation regions, but remains open to the user how many compensation regions the user wishes to select. An approximation using only one straight line is may not be enough, two compensation regions yield a very good result, but, in order to be able to better detect the curvatures in the measured characteristic curve K2, it is also possible to choose three or four (or even more) compensation regions.

The characteristic curve K2 in FIG. 4 may additionally be measured again for low currents through the load L since an expedient dimensioning is difficult in the case of a resolution as in FIG. 4 (IC, ID, RC, RD). In FIG. 4 everything may be shown in one graph for the sake of a better understanding of the principle.

Once the safety times for the output stage PST have been determined and are fixed, with a slow, almost static, setpoint value NV (for example a triangle with a period of 2 Hz) the current IL through the load L or directly the setpoint value AV and the controller voltage UR at the output of the controller device RE are measured. The amplitude may be chosen with a sufficient magnitude such that even the linear part of the characteristic curve K2, attributable to the resistance RL of the load L, becomes discernible.

A straight line is then placed into the linear part of the characteristic curve K2 and the nonlinear portions are approximated by straight lines (FIG. 4). The gradients of the straight lines are determined. For each region, individual gradients are determined by subtraction from the straight lines. By way of example, as an additional gradient the gradient caused by the resistance RL of the load L is also included in the straight line through RB and RC in accordance with FIG. 4. Therefore, the gradient between RA and RB must be subtracted from the gradient between RB and RC in order to arrive at the effect of the safety times alone.

A diagram of current compensation control signal is then determined and the individual gradients and the final values thereof are entered in this diagram (e.g. in FIG. 5 a final value of an individual gradient is IC/RCT). The diagram is then normalized to the setpoint value NV as X-axis. The circuit of the compensation device NLC is configured by the individual gradients and the final values thereof.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A circuit for generating a current for an inductive load, the circuit comprising:
   a switched output stage configured to generate the current from a supply voltage;
   a modulator configured to modulate the supply voltage of the switched output stage dependent on a modulator input signal of the modulator;
   a current measuring device configured to determine an actual value of the current;
   a controller configured to generate a controller signal depending on a setpoint value of the current and the actual value of the current;
   a compensator configured to generate from the setpoint value of the current at least one compensation control signal that compensates for nonlinearities of the output stage; wherein the at least one compensation control signal is in each case linear between a plurality of knee points of the setpoint value of the current and the at least one compensation control signal is constant starting from a last knee point of the plurality of knee points; and
   a summer configured to generate the modulator input signal additively from the controller signal and the at least one compensation control signal.

2. The circuit of claim 1, wherein the compensation control signal is linear with a first gradient between zero and a first knee point of the plurality of knee points, is linear with a second gradient between the first knee point and a second knee point of the plurality of knee points and is constant starting from the second knee point.

3. The circuit of claim 2, wherein the outputs of the operational amplifiers are connected to inputs of the summer via resistors.

4. The circuit of claim 2, wherein the compensator comprises two parallel connected operational amplifiers, wherein a first input of the connected operational amplifier is input with the setpoint value of the current via a plurality of resistors, wherein the first input of the operational amplifiers is connected to the associated outputs of the operational amplifiers by two zener diodes connected back-to-back in series.

5. The circuit of claim 1, wherein the switched output stage comprises a plurality of semiconductor switching elements, wherein the compensation control signal is further configured to compensate for nonlinearities caused by semiconductor forward voltages by safety times during the switching of the switching elements and by nonlinear switching properties of the switching elements.

6. The circuit of claim 1, wherein the compensator comprises two parallel connected operational amplifiers, wherein a first input of the connected operational amplifier is input with the setpoint value of the current via a plurality of resistors, wherein the first input of the operational amplifiers is connected to the associated outputs of the operational amplifiers by two Zener diodes connected back-to-back in series.

7. The circuit of claim 6, wherein one of the two parallel operational amplifiers generates the compensation control signal with the first gradient, and the other parallel operational amplifier forms the compensation control signal with the second gradient.

8. The circuit of claim 6, wherein the outputs of the operational amplifiers are connected to inputs of the summer via resistors.

9. The circuit of claim 1, wherein the compensator further comprises: a series connected set of a first comparator, a first multiplexer, a second comparator and a second multiplexer;
   wherein the setpoint value of the current and a limit value are present at the input of the first comparator and of the first multiplexer;
   wherein the first multiplexer switches between the limit value and the setpoint value as a function of the output of the first comparator,
   wherein the output of the first multiplexer and an inverted limit value are present at the input of the second comparator,
   wherein the inverted limit value and the output of the first multiplexer are present at the input of the second multiplexer, and
   wherein the second multiplexer switches between the inverted limit value and the output of the first multiplexer as a function of the output of the second comparator.

10. The circuit of claim 9, wherein the compensator further comprises a second series of connected first comparator, first multiplexer, second comparator, and second multiplexer connected in parallel with the first set, wherein the outputs of the two second multiplexers are input to the summer indirectly as compensation control signal.

11. The circuit of claim 1, further comprising:
   a differential advance control connected in parallel with the controller device; wherein the differential advance control is configured to input the setpoint value of the current and the output directly to an input of the summer.

12. The circuit of claim 1, further comprising:
a multiplier connected between the summer and the modulator;
the multiplier configured to compensate for changes in an uncontrolled supply voltage of the output stage.

13. A system for magnetic resonance imaging comprising:
a gradient amplifier output stage configured to generate the current from a supply voltage;
a modulator configured to modulate the supply voltage of the gradient amplifier output stage dependent on a modulator input signal of the modulator;
a current measuring device configured to determine an actual value of the current;
a controller configured to generate a controller signal depending on a setpoint value of the current and the actual value of the current;
a compensator configured to generate from the setpoint value of the current at least one compensation control signal that compensates for nonlinearities of the gradient amplifier output stage; wherein the compensator comprises two parallel connected operational amplifiers, wherein an input of each of the connected operational amplifier is input with the setpoint value of the current via a plurality of resistors, wherein the input of the operational amplifiers is connected to the associated outputs of the connected operational amplifiers by two Zener diodes connected back-to-back in series;
a summer configured to generate the modulator input signal additively from the controller signal and the at least one compensation control signal;
a differential advance control connected in parallel with the controller; wherein the differential advance control is configured to input the setpoint value of the current and the output directly to an input of the summer; and
a multiplier connected between the summer and the modulator, the multiplier configured to compensate for changes in an uncontrolled supply voltage of the gradient amplifier output stage.

14. A method for generating a current for an inductive load, the method comprising:
generating the current from a supply voltage by a switched output stage;
modulating the supply voltage of the switched output stage as a function of a modulator input signal of a modulator;
determining an actual value of the current;
generating a controller signal as a function of a setpoint value of the current and the actual value of the current;
generating at least one compensation control signal from the setpoint value of the current that compensates for nonlinearities of the output stage; wherein the at least one compensation control signal is in each case linear between a plurality of knee points of the setpoint value of the current and the at least one compensation control signal is constant starting from a last knee point of the plurality of knee points; and
generating the modulator input signal by addition of the controller signal and the at least one compensation control signal.

15. The method of claim 14, wherein the compensation control signal is linear with a first gradient between zero and a first knee point of the plurality of knee points, is linear with a second gradient between the first knee point and the second knee point of the plurality of knee points, and is constant starting from the second knee point.

16. The method of claim 14, wherein the plurality of knee points and a gradient at the plurality of knee points is determined from a measured controller signal when there is a static current.

17. The method of claim 16, wherein the plurality of knee points are determined by comparison with a reference signal and the gradient are determined by a linear regression.

18. The method of claim 14, wherein the compensation control signal compensates for the nonlinearities of the output stage that are caused by semiconductor forward voltages, by safety times during the switching of a plurality of switching elements and by nonlinear switching properties of the plurality of switching elements.

* * * * *